United States Patent
Arakawa et al.

(10) Patent No.: US 10,195,737 B2
(45) Date of Patent: Feb. 5, 2019

(54) PIEZOELECTRIC DRIVE DEVICE, ROBOT, AND METHOD FOR DRIVING PIEZOELECTRIC DRIVE DEVICE

(71) Applicant: Seiko Epson Corporation, Tokyo (JP)

(72) Inventors: Yutaka Arakawa, Hara (JP); Akio Konishi, Matsumoto (JP); Yasuharu Hashimoto, Minamiminowa (JP); Osamu Miyazawa, Shimisuwa (JP); Tomohisa Iwazaki, Matsumoto (JP); Yuichiro Tsuyuki, Matsumoto (JP)

(73) Assignee: Seiko Epson Corporation (JP)

( * ) Notice: Subject to any disclaimer, the term of this patent is extended or adjusted under 35 U.S.C. 154(b) by 248 days.

(21) Appl. No.: 15/193,269

(22) Filed: Jun. 27, 2016

(65) Prior Publication Data

US 2017/0001306 A1     Jan. 5, 2017

(30) Foreign Application Priority Data

Jul. 3, 2015    (JP) .................................. 2015-134198

(51) Int. Cl.
| | | |
|---|---|---|
| H01L 41/04 | (2006.01) | |
| B25J 9/12 | (2006.01) | |
| H01L 41/047 | (2006.01) | |
| H02N 2/00 | (2006.01) | |
| H02N 2/10 | (2006.01) | |

(52) U.S. Cl.
CPC .............. *B25J 9/12* (2013.01); *H01L 41/042* (2013.01); *H01L 41/0471* (2013.01); *H02N 2/004* (2013.01); *H02N 2/0055* (2013.01); *H02N 2/0065* (2013.01); *H02N 2/103* (2013.01); *H02N 2/108* (2013.01)

(58) Field of Classification Search
CPC . H01L 41/042; H01L 41/0471; H02N 2/0055; H02N 2/0065; H02N 2/103; H02N 2/108; H02N 2/004
USPC ........................................ 310/323.01–323.21
See application file for complete search history.

(56) References Cited

U.S. PATENT DOCUMENTS

| | | |
|---|---|---|
| 5,616,980 A | 4/1997 | Zumeris |
| 6,140,745 A | 10/2000 | Bryant |
| 2004/0256956 A1 | 12/2004 | Miyazawa |
| 2007/0052329 A1 | 3/2007 | Koc et al. |
| 2008/0272672 A1 | 11/2008 | Higashionji et al. |
| 2009/0026884 A1 | 1/2009 | Adachi et al. |

(Continued)

FOREIGN PATENT DOCUMENTS

| | | |
|---|---|---|
| EP | 1500810 A1 | 1/2005 |
| JP | 08-237971 A | 9/1996 |

(Continued)

OTHER PUBLICATIONS

Extended European Search Report for Application No. EP 16 17 7487, dated Feb. 13, 2017. (16 pages).

(Continued)

*Primary Examiner* — Derek Rosenau
(74) *Attorney, Agent, or Firm* — Harness, Dickey & Pierce, P.L.C.

(57) ABSTRACT

A piezoelectric drive device includes a vibrating body, a support portion formed integrally with the vibrating body, and a piezoelectric element formed of a first electrode film, a piezoelectric body film, and a second electrode film on at least one surface of the vibrating body.

17 Claims, 12 Drawing Sheets

(56) References Cited

U.S. PATENT DOCUMENTS

| | | |
|---|---|---|
| 2009/0091213 A1 | 4/2009 | Adachi |
| 2009/0256445 A1* | 10/2009 | Kotani ................. H02N 2/003 |
| | | 310/323.16 |
| 2010/0327696 A1* | 12/2010 | Ro ...................... H01L 41/0913 |
| | | 310/323.02 |
| 2012/0221029 A1 | 8/2012 | Hirabayashi et al. |
| 2012/0248805 A1* | 10/2012 | Kamijo ............... B25J 15/0009 |
| | | 294/213 |
| 2013/0140952 A1 | 6/2013 | Kamijo et al. |
| 2014/0015381 A1 | 1/2014 | Kikushima |
| 2015/0158184 A1 | 6/2015 | Kamijo et al. |

FOREIGN PATENT DOCUMENTS

| | | |
|---|---|---|
| JP | 2004-320979 A | 11/2004 |
| JP | 2005-168075 A | 6/2005 |
| JP | 2007-189900 A | 7/2007 |
| JP | 2007-306799 A | 11/2007 |
| JP | 2008-301698 A | 12/2008 |
| JP | 2008-312336 A | 12/2008 |
| JP | 2010-252626 A | 11/2010 |
| WO | WO-2007-080851 A1 | 7/2007 |

OTHER PUBLICATIONS

Extended European Search Report for Application No. EP 16 17 7487 dated Dec. 12, 2016 (8 pages).

* cited by examiner

PIEZOELECTRIC DRIVE DEVICE, ROBOT, AND METHOD FOR DRIVING PIEZOELECTRIC DRIVE DEVICE

BACKGROUND

1. Technical Field

The present invention relates to a piezoelectric drive device, a robot, and a method for driving a piezoelectric drive device.

2. Related Art

Piezoelectric actuators (piezoelectric drive devices) that vibrate a piezoelectric body to drive a driven body (driven member) are used in various fields because a magnet or a coil is not necessary (e.g., JP-A-2004-320979). A basic configuration of this piezoelectric drive device is a configuration in which four piezoelectric elements are disposed in two rows and two columns on each of two surfaces of a reinforcing plate. The piezoelectric element is bonded to the reinforcing plate with adhesive or the like.

In the piezoelectric drive device, miniaturizing the piezoelectric element makes it possible to obtain relatively high power (large power-weight ratio (output per unit mass)). However, when the piezoelectric element is bonded to the reinforcing plate (vibrating plate) with adhesive or the like, bonding accuracy is an obstacle to the miniaturization. Moreover, since an adhesive layer is present between the piezoelectric element and the reinforcing plate, there is a problem in that transmission loss of drive power is inevitable.

SUMMARY

An advantage of some aspects of the invention is to solve at least a part of the problems described above, and the invention can be implemented as the following aspects or application examples.

(1) According to an aspect of the invention, a piezoelectric drive device is provided. This piezoelectric drive device includes: a vibrating body; a support portion formed integrally with the vibrating body; and a piezoelectric element formed of a first electrode film, a piezoelectric body film, and a second electrode film on at least one surface of the vibrating body. According to this aspect, since the piezoelectric element formed of the first electrode film, the piezoelectric body film, and the second electrode film is provided on at least one surface of the vibrating body, transmission loss of drive power is less likely to occur.

(2) In the piezoelectric drive device of the aspect, the vibrating body may include a first vibrating body and a second vibrating body, the support portion may include a first support portion and a second support portion, the piezoelectric element may include a first piezoelectric element and a second piezoelectric element, and the piezoelectric drive device may include a first piezoelectric vibrating portion including the first vibrating body, the first support portion, and the first piezoelectric element, and a second piezoelectric vibrating portion including the second vibrating body, the second support portion, and the second piezoelectric element. According to this aspect, since two piezoelectric vibrating portions, the first piezoelectric vibrating portion and the second piezoelectric vibrating portion, are included, high power can be obtained.

(3) In the piezoelectric drive device of the aspect, the second piezoelectric vibrating portion may be stacked on the first piezoelectric vibrating portion. By stacking the second piezoelectric vibrating portion on the first piezoelectric vibrating portion, high power can be obtained.

(4) In the piezoelectric drive device of the aspect, the surface of the vibrating body on which the piezoelectric element is formed may have a rectangular shape including a first side, a second side, and a third side and a fourth side that are connected between the first side and the second side and longer than the first side, the support portion may include a fixed portion, a first connecting portion, and a second connecting portion, the first connecting portion may connect the third side with the fixed portion, the second connecting portion may connect the fourth side with the fixed portion, and the fixed portion may be disposed on the side closer to the second side than the first side. According to this aspect, since the first connecting portion, the second connecting portion, and the fixed portion are continuous with one another, the strength of the support portion can be increased.

(5) In the piezoelectric drive device of the aspect, a wiring for driving the piezoelectric element may be formed on the vibrating body, the first connecting portion, the second connecting portion, and the fixed portion. According to this aspect, an external wiring can be connected to the wiring formed on the fixed portion, so that space efficiency can be improved.

(6) In the piezoelectric drive device of the aspect, the piezoelectric drive device may further include a piezoelectric body film formed on the support portion. According to this aspect, since the piezoelectric body film is present also on the support portion, the thickness at the vibrating body and the thickness at the support portion can be made about the same.

(7) In the piezoelectric drive device of the aspect, the vibrating body may include a recess at the first side, a contact capable of contacting a driven member may be provided in the recess, and the recess and the contact may contact each other at two or more points. According to this aspect, since the contact is fitted into the recess at the first side, the contact can be made less likely to come off compared with the case where the recess is not present at the first side.

(8) In the piezoelectric drive device of the aspect, the recess may have a size capable of accommodating 30 to 70% of the volume of the contact. When the volume of the contact accommodated in the recess is too small, the contact is likely to come off; while when the volume of the contact accommodated in the recess is too large, the contact is less likely to contact a driven member.

(9) In the piezoelectric drive device of the aspect, the contact may contact the recess of the first vibrating body at two or more points and contact the recess of the second vibrating body at two or more points. According to this aspect, by interposing the contact between the two vibrating bodies, the contact can be supported at four or more points, so that the contact is still less likely to come off.

(10) In the piezoelectric drive device of the aspect, the vibrating body and the support portion may contain silicon. According to this aspect, since the piezoelectric drive device can be manufactured by applying a semiconductor manufacturing apparatus or a semiconductor manufacturing process, the piezoelectric drive device can be manufactured to be small with high accuracy.

(11) According to another aspect of the invention, a robot is provided. This robot includes: a plurality of link portions; a joint connecting the plurality of link portions together; and the piezoelectric drive device according to any of the aspects, which rotates the plurality of link portions with the joint. According to this aspect, the piezoelectric drive device can be used to drive the robot.

(12) According to still another aspect of the invention, a method for driving the piezoelectric drive device of the aspect is provided. This driving method includes applying, between the first electrode film and the second electrode film, a pulsating voltage that periodically changes and in which a direction of an electric field to be applied to the piezoelectric body film of the piezoelectric element is one direction from one of the first electrode film and the second electrode film toward the other electrode film. According to this aspect, since the direction of the voltage to be applied to the piezoelectric body film of the piezoelectric element is only one direction, the durability of the piezoelectric body film can be improved.

The invention can be implemented in various aspects. For example, in addition to the piezoelectric drive device, the invention can be implemented in various aspects such as a method for a driving piezoelectric drive device, a method for manufacturing a piezoelectric drive device, a robot in which a piezoelectric drive device is mounted, a method for a driving the robot in which the piezoelectric drive device is mounted, an electronic component conveying apparatus, a liquid feed pump, and a dosing pump.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
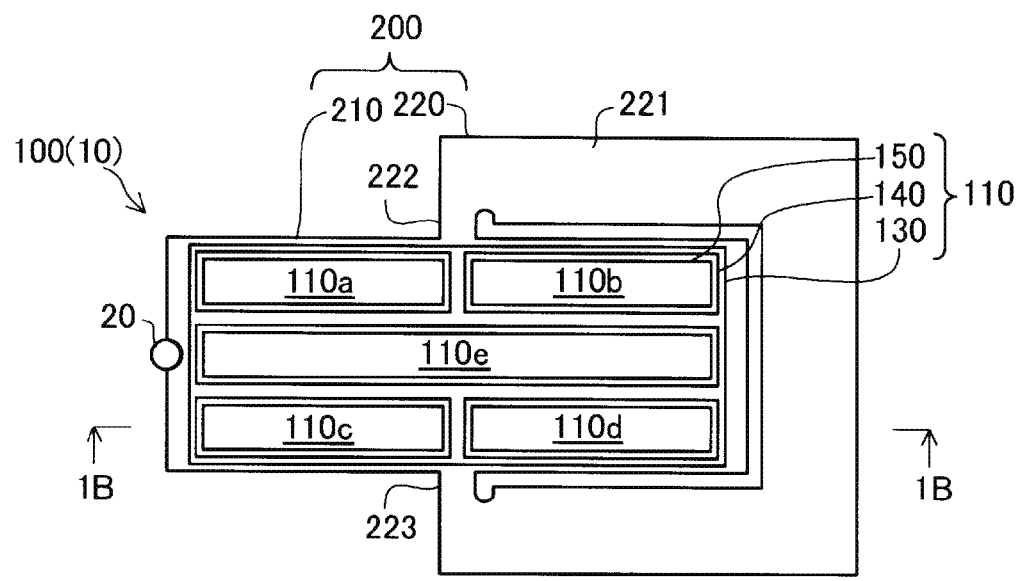
FIGS. 1A and 1B are explanatory views showing a schematic configuration of a piezoelectric vibrating portion.
Figure 1B:
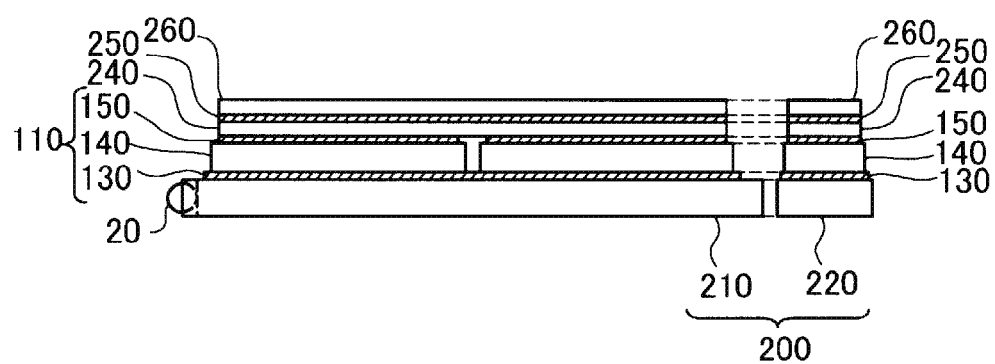

FIGS. 1A and 1B are explanatory views showing a schematic configuration of a piezoelectric vibrating portion 100, in which FIG. 1A is a plan view and FIG. 1B is a cross-sectional view along 1B-1B of FIG. 1A. In the plan view shown in FIG. 1A, an insulating layer 240, a wiring electrode 250, and a protective film 260 shown in FIG. 1B are omitted. First, the relationship between a piezoelectric drive device 10 and the piezoelectric vibrating portion 100 will be described. The piezoelectric drive device 10 includes one or more piezoelectric vibrating portions 100. Hence, when there is only one piezoelectric vibrating portion 100, the piezoelectric drive device 10 and the piezoelectric vibrating portion 100 are the same.

The piezoelectric vibrating portion 100 includes a substrate 200, a piezoelectric element 110, the insulating layer 240, the wiring electrode 250, and the protective film 260. The substrate 200 includes a vibrating body 210 and a support portion 220. The vibrating body 210 and the support portion 220 are connected at the middle of the long side of the vibrating body 210. In the support portion 220, edge portions connected with the vibrating body 210 are referred to as first connecting portion 222 and second connecting portion 223; and a portion other than the first connecting portion 222 and the second connecting portion 223 is referred to as fixed portion 221. When the first connecting portion 222 and the second connecting portion 223 are not distinguished from each other, the first connecting portion 222 and the second connecting portion 223 are also referred to as connecting portion 222 and connecting portion 223, respectively. The piezoelectric element 110 is formed on the substrate 200. The insulating layer 240, the wiring electrode 250, and the protective film 260 are formed on the piezoelectric element 110.

The piezoelectric element 110 includes a first electrode 130 (also referred to as first electrode film 130 because it is formed into a film), a piezoelectric body 140 (also referred to as piezoelectric body film 140 because it is formed into a film) formed on the first electrode 130, and a second electrode 150 (also referred to as second electrode film 150 because it is formed into a film) formed on the piezoelectric body 140. The first electrode 130 and the second electrode 150 interpose the piezoelectric body 140 therebetween. The first electrode 130 or the second electrode 150 is a thin film formed by, for example, sputtering. As the material of the first electrode 130 or the second electrode 150, for example, any material having high conductivity, such as Al (aluminum), Ni (nickel), Au (gold), Pt (platinum), Ir (iridium), or Cu (copper), can be used.

The piezoelectric body 140 is formed by, for example, a sol-gel method or sputtering method, and has a thin film shape. As the material of the piezoelectric body 140, any material exhibiting a piezoelectric effect, such as ceramics having an $ABO_3$-type perovskite structure, can be used. As the ceramics having an $ABO_3$-type perovskite structure, for example, lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, lead scandium niobate, or the like can be used. Moreover, a material exhibiting a piezoelectric effect other than ceramic, for example, polyvinylidene fluoride, quartz crystal, or the like can also be used. The thickness of the piezoelectric body 140 is, for example, preferably in the range of from 50 nm (0.05 μm) to 20 μm. The thin film of the piezoelectric body 140 having a thickness in this range can be easily formed using a film forming process (also referred to as "deposition process"). When the thickness of the piezoelectric body 140 is 0.05 μm or more, sufficiently large power can be generated in response to expansion or contraction of the piezoelectric body 140. When the thickness of the piezoelectric body 140 is 20 µm or less, the piezoelectric vibrating portion 100 can be sufficiently miniaturized.

In the embodiment, the piezoelectric vibrating portion 100 includes, as the piezoelectric element 110, five piezoelectric elements 110a, 110b, 110c, 110d, and 110e. The piezoelectric element 110e is formed into a substantially rectangular shape, and formed along the longitudinal direction of the vibrating body 210 in the middle of the vibrating body 210 in the width direction thereof. The piezoelectric elements 110a, 110b, 110c, and 110d are formed in the positions of four corners of the vibrating body 210. In FIGS. 1A and 1B, an example in which the piezoelectric element 110 is formed on one surface of the vibrating body 210; however, the piezoelectric element 110 may be formed on two surfaces of the vibrating body 210. In this case, the piezoelectric elements 110a to 110e on one surface and the piezoelectric elements 110a to 110e on the other surface are preferably disposed in symmetrical positions with respect to the vibrating body 210 as a symmetrical plane.

The substrate 200 is used as a substrate for forming the first electrode 130, the piezoelectric body 140, and the second electrode 150 by the film forming process. Moreover, the vibrating body 210 of the substrate 200 has also a function as a vibrating plate that performs mechanical vibration. The substrate 200 can be formed of, for example, Si, $Al_2O_3$, $ZrO_2$, or the like. As the substrate 200 made of Si (also referred to as silicon substrate 200), for example, a Si wafer for semiconductor manufacture can be used. The thickness of the substrate 200 is, for example, preferably in the range of from 10 to 100 µm. When the thickness of the substrate 200 is 10 µm or more, the substrate 200 can be relatively easily handled in a process of deposition on the substrate 200. When the thickness of the substrate 200 is 50 µm or more, the substrate 200 can be more easily handled. When the thickness of the substrate 200 (the vibrating body 210) is 100 µm or less, the vibrating body 210 can be easily vibrated in response to expansion or contraction of the piezoelectric body 140 formed of a thin film.

In the embodiment, the first electrode 130, the piezoelectric body 140, the second electrode 150, the insulating layer 240, the wiring electrode 250, and the protective film 260 are formed also on the support portion 220. As a result, the thickness of the piezoelectric vibrating portion 100 at the vibrating body 210 and the thickness of the piezoelectric vibrating portion 100 at the support portion 220 can be made about the same (e.g., the difference between the thicknesses can be 6 µm or less or 3 µm or less). Due to this, when the piezoelectric drive device 10 is composed of a plurality of piezoelectric vibrating portions 100 stacked on each other, a gap between two adjacent piezoelectric vibrating portions 100 on the vibrating body 210 and a gap between two adjacent piezoelectric vibrating portions 100 on the support portion 220 can be made about the same. Therefore, rattling between the piezoelectric vibrating portions 100 is less likely to occur. The first electrode 130, the piezoelectric body 140, and the second electrode 150 on the fixed portion 221 preferably do not constitute an operable piezoelectric element. If they do not constitute an operable piezoelectric element, the piezoelectric body 140 is not deformed, and therefore, the fixed portion 221 is easily fixed to another member. In the embodiment, as will be described later, a voltage is applied via the wiring electrode 250 to the first electrode 130 and the second electrode 150 on the vibrating body 210. In order not to constitute an operable piezoelectric element, at least one of the following ways may be employed: (i) the first electrode 130 and the second electrode 150 on the fixed portion 221 are not connected with the wiring electrode 250 for applying a voltage to the first electrode 130 and the second electrode 150 on the vibrating body 210; and (ii) the first electrode 130 on the fixed portion 221 and the second electrode 150 above the fixed portion 221 are connected to each other. The electrodes 130 and 150 on the fixed portion 221 and the electrodes 130 and 150 on the vibrating body 210 are not connected to each other, and are separated from each other. In the above description, the first electrode 130, the piezoelectric body 140, and the second electrode 150 are formed on the support portion 220 (the fixed portion 221 and the connecting portions 222 and 223); however, a configuration may be employed in which the first electrode 130, the piezoelectric body 140, and the second electrode 150 are not formed on the connecting portions 222 and 223 in the support portion 220.

Figure 2:
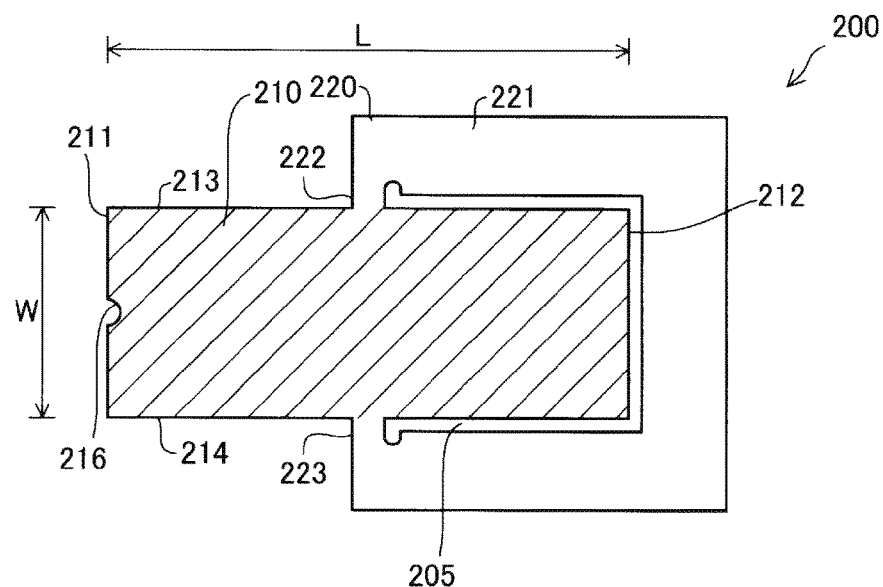
FIG. 2 is a plan view showing a substrate.

FIG. 2 is a plan view showing the substrate 200. The substrate 200 includes the vibrating body 210 and the support portion 220 (the fixed portion 221 and the connecting portions 222 and 223). In FIG. 2, in order to make it easier to distinguish the vibrating body 210 from the support portion 220, the vibrating body 210 is hatched while the support portion 220 (the fixed portion 221 and the connecting portions 222 and 223) is not hatched. The vibrating body 210 has a rectangular shape including four sides, a first side 211, a second side 212, a third side 213, and a fourth side 214. The first side 211 and the second side 212 are opposed to each other, while the third side 213 and the fourth side 214 are opposed to each other. The third side 213 and the fourth side 214 are each connected between the first side 211 and the second side 212, and longer than the first side. The two connecting portions 222 and 223 are provided respectively at the edge portions of the fixed portion 221, and connected to the middle positions of the third side 213 and the fourth side 214, respectively, of the vibrating body 210. The fixed portion 221 is disposed on the side closer to the second side 212 than the first side 211 so as to turn around the second side 212 side from the first connecting portion 222 to the second connecting portion 223. The vibrating body 210 and the support portion 220 are integrally formed from one silicon substrate. Specifically, by etching a silicon substrate on which the piezoelectric element 110 is formed, the shape of an individual substrate 200 is formed, and at the same time, a gap 205 between the vibrating body 210 and the support portion 220 is formed. Due to this, the vibrating body 210 and the support portion 220 (the fixed portion 221 and the connecting portions 222 and 223) are integrally formed.

The ratio of a length L (length of the third side 213 and the fourth side 214) to a width W (length of the first side 211 and the second side 212) of the vibrating body 210 is preferably L:W=about 7:2. This ratio is a preferable value for the vibrating body 210 to perform ultrasonic vibration (described later) in which the vibrating body 210 flexes from side to side along the plane thereof. The length L of the vibrating body 210 can be, for example, in the range of from 0.1 to 30 mm, while the width W can be, for example, in the range of from 0.02 to 9 mm. In order for the vibrating body 210 to perform the ultrasonic vibration, the length L is preferably 50 mm or less.

A recess 216 is formed at the first side 211 of the vibrating body 210. A contact 20 capable of contacting a driven member is fitted into and joined to (usually bonded to) the recess 216. The contact 20 is a member that contacts the driven member to provide power to the driven member. The contact 20 is preferably formed of a material having durability, such as ceramics (e.g., $Al_2O_3$).

Figure 3:
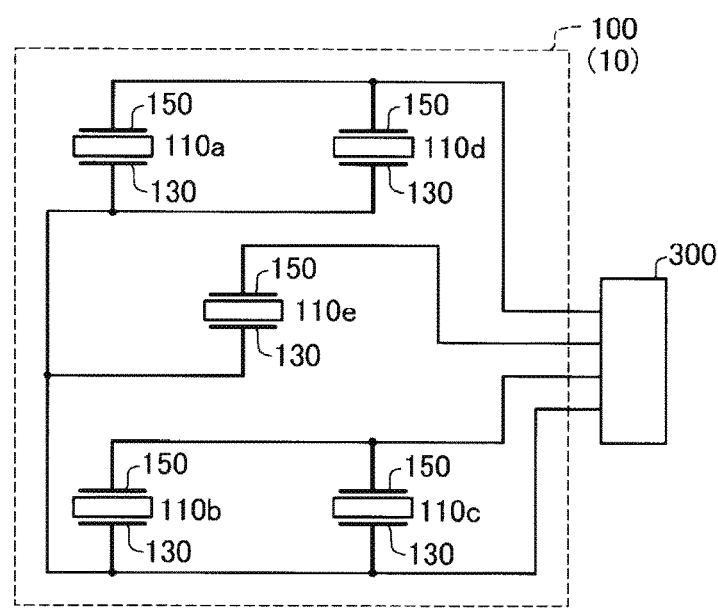
FIG. 3 is an explanatory view showing an equivalent circuit of a piezoelectric drive device.

FIG. 3 is an explanatory view showing an equivalent circuit of the piezoelectric drive device 10. The equivalent circuit shown in FIG. 3 illustrates an example of operating one piezoelectric vibrating portion 100. The piezoelectric elements 110 are divided into three groups. A first group includes two piezoelectric elements 110a and 110d. A second group includes two piezoelectric elements 110b and 110c. A third group includes only one piezoelectric element 110e. The piezoelectric elements 110a and 110d of the first group are connected in parallel with each other, and connected to a drive circuit 300. The piezoelectric elements 110b and 110c of the second group are connected in parallel with each other, and connected to the drive circuit 300. The piezoelectric element 110e of the third group is singly connected to the drive circuit 300.

The drive circuit 300 applies a periodically changing AC voltage or pulsating voltage between the first electrode 130 and the second electrode 150 of predetermined piezoelectric elements of the five piezoelectric elements 110a to 110e, for example, the piezoelectric elements 110a and 110d of the first group, and thereby ultrasonically vibrates the piezoelectric vibrating portion 100, so that a rotor (driven body or driven member) that contacts the contact 20 can be rotated in a predetermined rotational direction. Here, the "pulsating voltage" means a voltage obtained by adding a DC offset to an AC voltage, in which the direction of the voltage (electric field) of the pulsating voltage is one direction from one of the electrodes toward the other electrode. The direction of a current is preferably from the second electrode 150 toward the first electrode 130 rather than from the first electrode 130 toward the second electrode 150. Moreover, by applying the AC voltage or pulsating voltage between the first electrode 130 and the second electrode 150 of the piezoelectric elements 110b and 110c of the second group, the rotor contacting the contact 20 can be rotated in the opposite direction.

Figure 4:
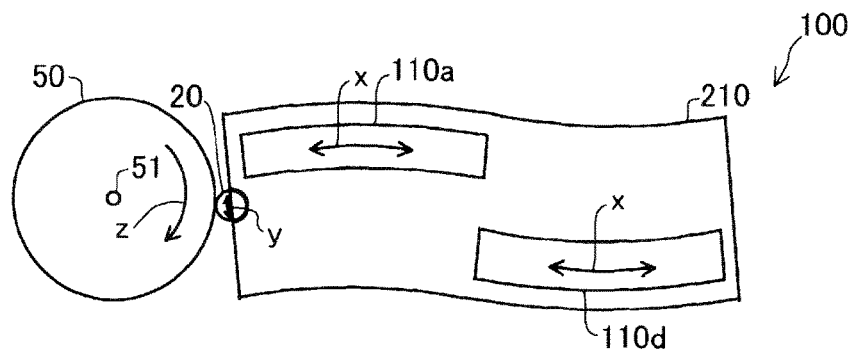
FIG. 4 is an explanatory view showing an example of the operation of the piezoelectric vibrating portion.

FIG. 4 is an explanatory view showing an example of the operation of the piezoelectric vibrating portion 100. The contact 20 of the piezoelectric vibrating portion 100 is in contact with the perimeter of a rotor 50 as a driven member. In the example shown in FIG. 4, the AC voltage or pulsating voltage is applied to the two piezoelectric elements 110a and 110d of the first group, and the piezoelectric elements 110a and 110d expand or contract in the direction of an arrow x in FIG. 4. In response to the expansion or contraction, the vibrating body 210 of the piezoelectric vibrating portion 100 flexes in the plane of the vibrating body 210 and is deformed in a serpentine shape (S-shape), so that the tip of the contact 20 performs a reciprocating motion in the direction of an arrow y, or performs an elliptical motion. As a result, the rotor 50 rotates in a predetermined direction z (clockwise direction in FIG. 4) about a center 51 thereof. When the drive circuit 300 applies the AC voltage or pulsating voltage to the two piezoelectric elements 110b and 110c (FIGS. 1A and 1B) of the second group, the rotor 50 rotates in the opposite direction. When the AC voltage or pulsating voltage is applied to the piezoelectric element 110e in the middle, the piezoelectric drive device 10 expands or contracts in the longitudinal direction, and therefore, power provided from the contact 20 to the rotor 50 can be made larger. The above-described operation of the piezoelectric drive device 10 (or the piezoelectric vibrating portion 100) is described in JP-A-2004-320979 or corresponding U.S. Pat. No. 7,224,102, the disclosure content of which is incorporated herein by reference.

Figure 5:
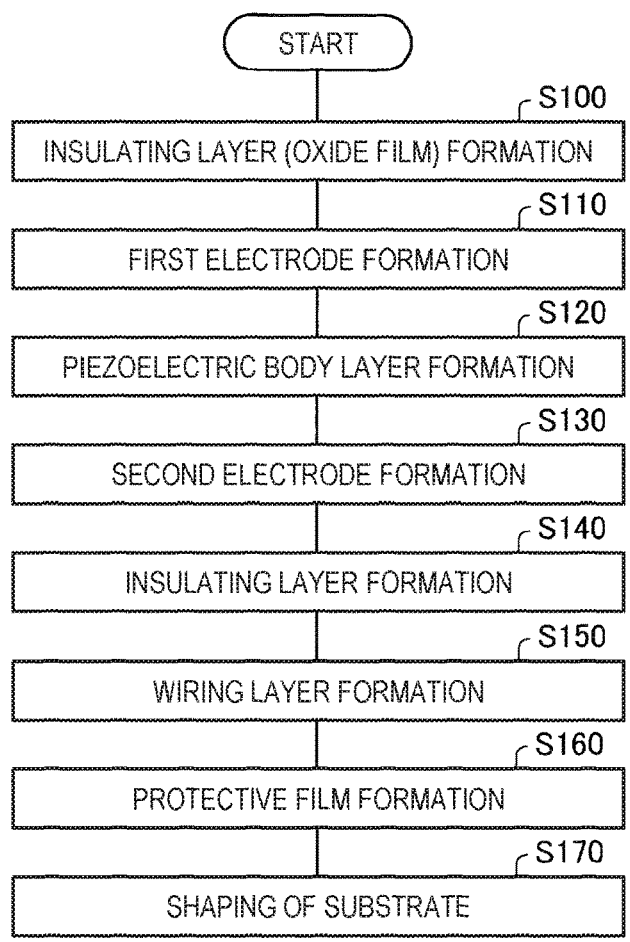
FIG. 5 is an explanatory view showing a flowchart showing a film forming process performed in the manufacturing process of the piezoelectric vibrating portion.
Figure 6:
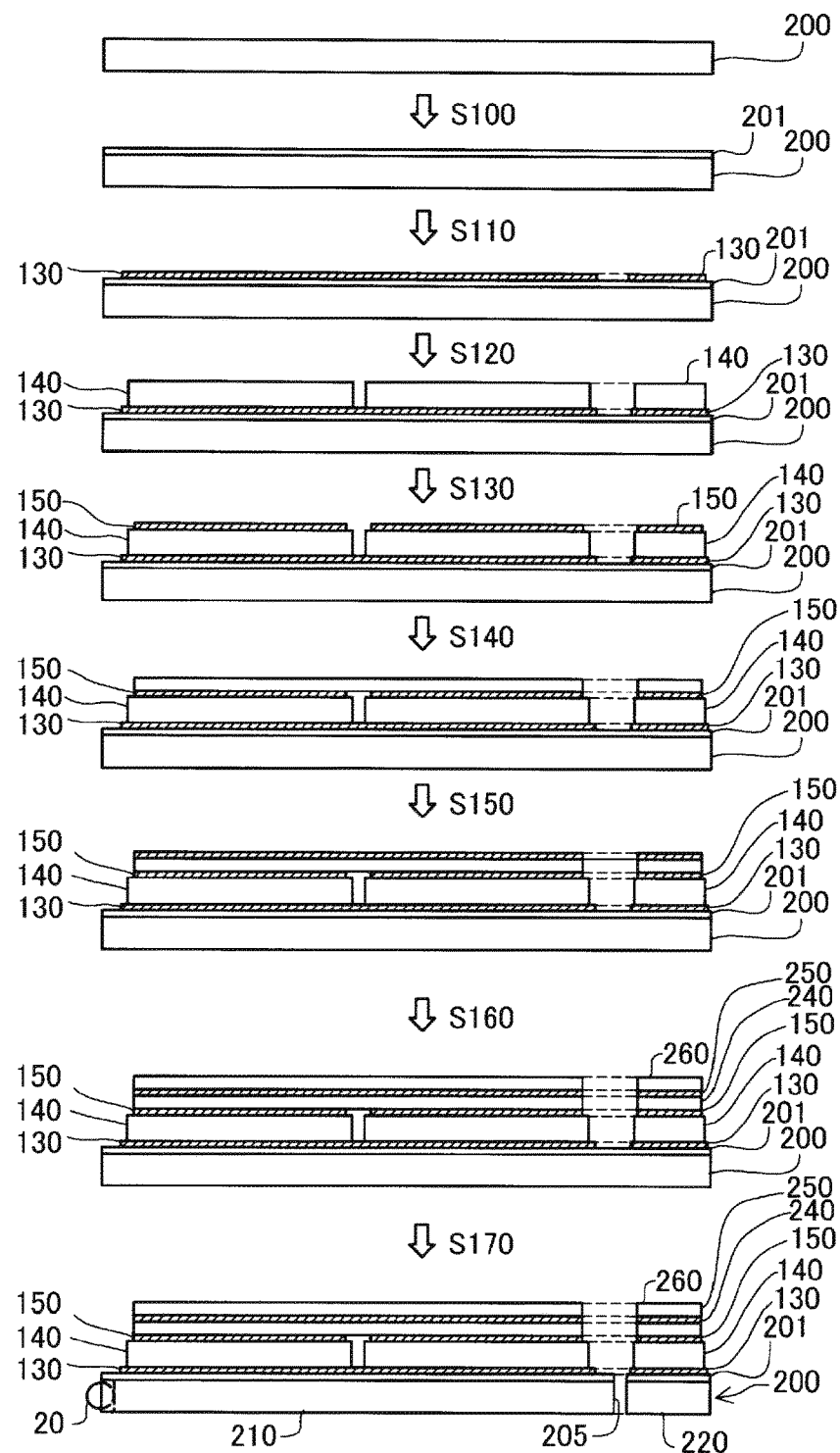
FIG. 6 is an explanatory view illustrating the manufacturing process of the piezoelectric vibrating portion.

FIG. 5 is an explanatory view showing a flowchart showing a film forming process performed in the manufacturing process of the piezoelectric vibrating portion 100. FIG. 6 is an explanatory view illustrating the manufacturing process of the piezoelectric vibrating portion 100. In Step S100, an insulating layer 201 is formed on the substrate 200. As the substrate 200, for example, a Si wafer can be used. A plurality of piezoelectric vibrating portions 100 can be formed on one Si wafer. As the insulating layer 201, for example, a $SiO_2$ layer that is formed by thermally oxidizing the surface of the substrate 200 can be used. In FIGS. 1A and 1B, the insulating layer 201 is omitted. In addition, alumina ($Al_2O_3$) or an organic material such as acrylic resin or polyimide can be used as the insulating layer 201. When the substrate 200 is an insulator, the process for forming the insulating layer 201 can be omitted.

In Step S110, the first electrode 130 is formed and patterned. The first electrode 130 can be formed by, for example, sputtering, and the patterning can be performed by etching.

In Step S120, the piezoelectric body 140 is formed on the first electrode 130, and patterned. The formation of the piezoelectric body 140 can be performed using, for example, a sol-gel method. That is, by dropping a sol-gel solution of a piezoelectric body material on the substrate 200 (the first electrode 130) and rotating the substrate 200 at a high speed, a thin film of the sol-gel solution is formed on the first electrode 130. Thereafter, the thin film is calcined at a temperature of from 200 to 300° C. to form a first layer of the piezoelectric body material on the first electrode 130. Thereafter, by repeating a cycle of dropping of the sol-gel solution, high-speed rotation, and calcination multiple times, a piezoelectric body layer is formed to a desired thickness on the first electrode 130. The thickness of one piezoelectric body layer formed in one cycle is about from 50 to 150 nm although it depends on the viscosity of the sol-gel solution or the rotational speed of the substrate 200. After the piezoelectric body layer is formed to the desired thickness, the piezoelectric body layer is sintered at a temperature of from 600 to 1000° C. to thereby form the piezoelectric body 140. When the thickness of the piezoelectric body 140 after sintering is from 50 nm (0.05 μm) to 20 μm, the piezoelectric drive device 10 having a small size can be realized. When the thickness of the piezoelectric body 140 is 0.05 μm or more, sufficiently large power can be generated in response to expansion or contraction of the piezoelectric body 140. When the thickness of the piezoelectric body 140 is 20 μm or less, sufficiently large power can be generated even if a voltage to be applied to the piezoelectric body 140 is 600V or less. As a result, the drive circuit 300 for driving the piezoelectric drive device 10 can be composed of inexpensive elements. The thickness of the piezoelectric body may be 400 nm or more, in which case the power generated by the piezoelectric element can be made large. The temperature or time for calcination or sintering is an example, and appropriately selected depending on the piezoelectric body material.

When the thin film of the piezoelectric body material is formed and then sintered using the sol-gel method, there are advantages that (a) it is easy to form a thin film, that (b) crystallization with lattice directions aligned is easily made, and that (c) the breakdown voltage of the piezoelectric body can be improved, compared with a related-art sintering method in which raw material powders are mixed and sintered.

In the embodiment, in Step S120, the patterning of the piezoelectric body 140 is performed by ion milling using argon ion beams. Instead of performing the patterning using ion milling, the patterning may be performed by any other patterning method (e.g., dry etching using a chlorine-based gas).

In Step S130, the second electrode 150 is formed on the piezoelectric body 140, and patterned. The formation and patterning of the second electrode 150 can be performed by sputtering and etching similarly to the first electrode 130.

In Step S140, the insulating layer 240 is formed on the second electrode 150. In Step S150, the wiring electrode 250 is formed on the insulating layer 240.

Figure 7:
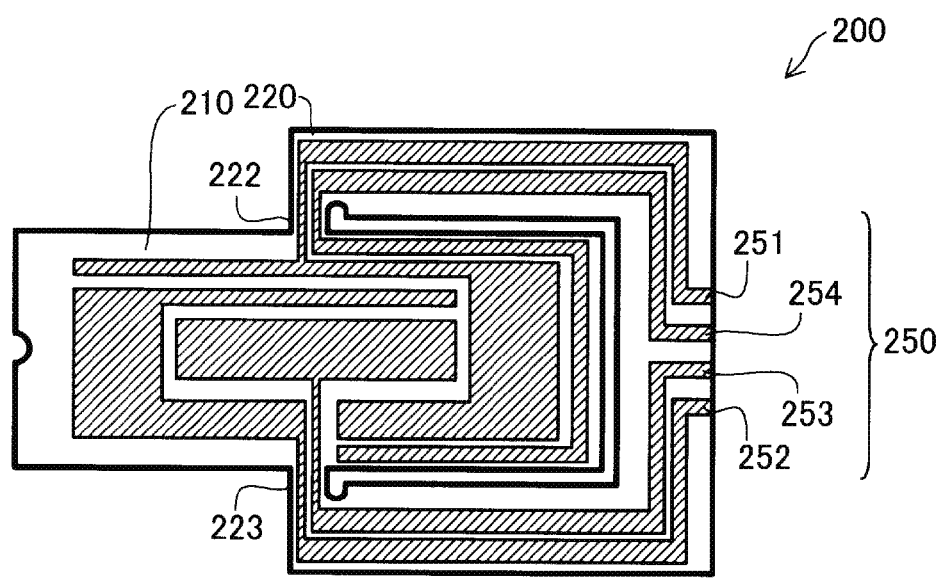
FIG. 7 is an explanatory view showing patterns of a wiring electrode.

FIG. 7 is an explanatory view showing patterns of the wiring electrode 250. The wiring electrode 250 includes four wiring patterns 251, 252, 253, and 254. These wiring patterns 251 to 254 are formed from above the fixed portion 221 through above the connecting portions 222 and 223 to above the vibrating body 210. The first wiring pattern 251 is connected, above the vibrating body 210, with the second electrodes 150 of the piezoelectric elements 110a and 110d (FIGS. 1A and 1B). Similarly, the second wiring pattern 252 is connected, above the vibrating body 210, with the second electrodes 150 of the piezoelectric elements 110b and 110c; the third wiring pattern 253 is connected, above the vibrating body 210, with the second electrode 150 of the piezoelectric element 110e; and the fourth wiring pattern 254 is connected, above the vibrating body 210, with the first electrodes 130 of the piezoelectric elements 110a, 110b, 110c, 110d, and 110e. Moreover, these wiring patterns 251 to 254 are connected, above the support portion 220 (except above the connecting portions 222 and 223), with a wiring from the drive circuit 300. The wiring patterns 251 to 254 are not connected with the first electrode 130 and the second electrode 150 on the fixed portion 221.

In Step S160, the protective film 260 is formed. In Step S170, the shape of the individual substrate 200 is formed by etching; and at the same time, the gap 205 is formed between the vibrating body 210 and the support portion 220, and the recess 216 is formed at the first side 211. The contact 20 is bonded to the recess 216 with adhesive.

According to the embodiment as described above, the vibrating body 210 and the support portion 220 (the fixed portion 221 and the connecting portions 222 and 223) are integrally formed, and the piezoelectric element 110 formed of the first electrode 130, the piezoelectric body 140, and the second electrode 150 is provided on at least one surface of the vibrating body 210. Therefore, an adhesive layer is not present between the vibrating body 210 and the piezoelectric element 110, so that transmission loss of drive power is less likely to occur.

Figure 8A:
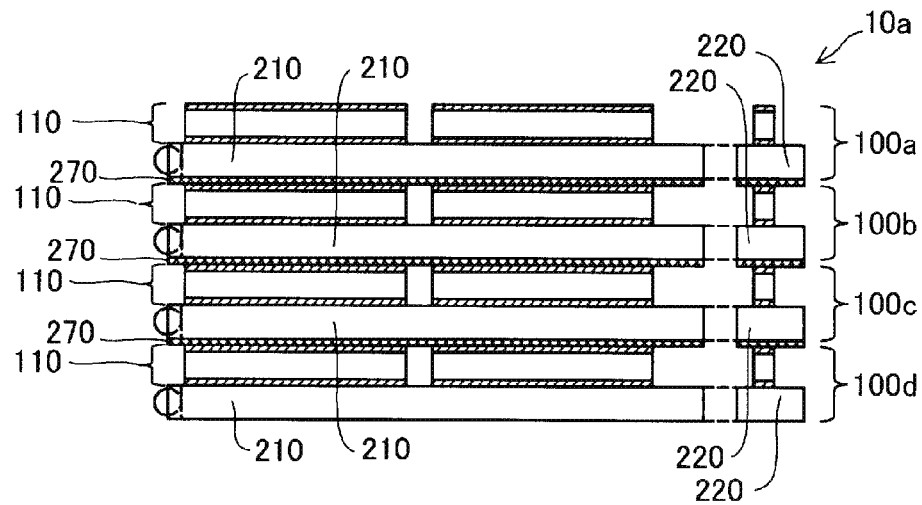
FIGS. 8A to 8C are explanatory views each showing a configuration example of a piezoelectric drive device.
Figure 8B:
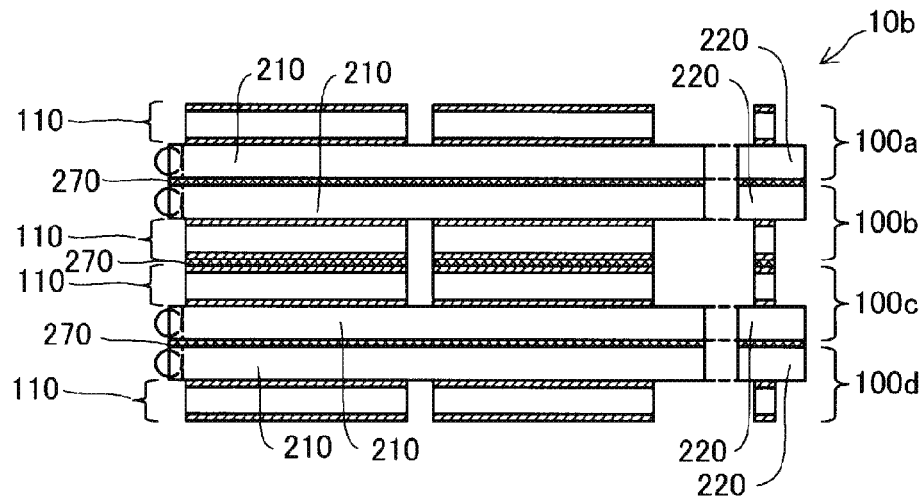
Figure 8C:
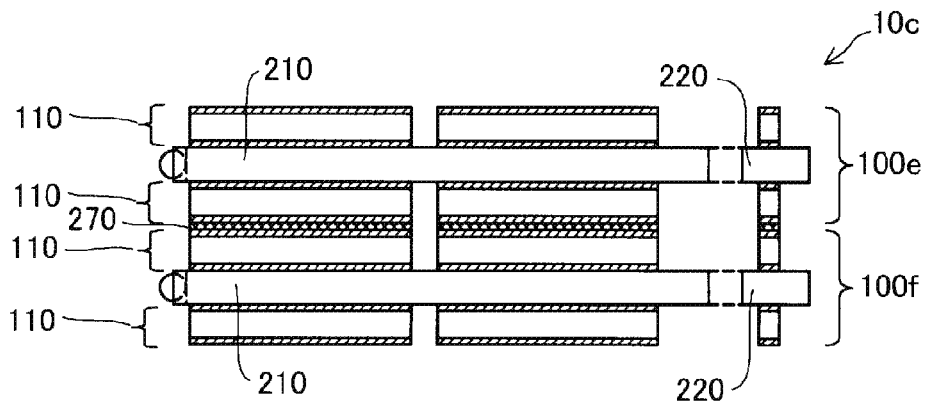

FIGS. 8A to 8C are explanatory views each showing a configuration example of a piezoelectric drive device. A piezoelectric drive device 10a shown in FIG. 8A includes four piezoelectric vibrating portions 100a, 100b, 100c, and 100d. Each of the piezoelectric vibrating portions 100a to 100d includes the vibrating body 210 and the support portion 220, similarly to the piezoelectric vibrating portion 100 described above. The support portion, fixed portion, vibrating body, and piezoelectric element of the first piezoelectric vibrating portion 100a are referred to as "first support portion", "first fixed portion", "first vibrating body", and "first piezoelectric element"; and the support portion, fixed portion, vibrating body, and piezoelectric element of the second piezoelectric vibrating portion 100b are referred to as "second support portion", "second fixed portion", "second vibrating body", and "second piezoelectric element". The same applies to the third piezoelectric vibrating portion 100c and the fourth piezoelectric vibrating portion 100d. In this example, the vibrating body 210 of the first piezoelectric vibrating portion 100a and the piezoelectric element 110 (second piezoelectric element) of the second piezoelectric vibrating portion 100b adjacent to the first piezoelectric vibrating portion 100a are bonded together with an adhesive layer 270.

Similarly, a piezoelectric drive device 10b shown in FIG. 8B includes four piezoelectric vibrating portions 100a, 100b, 100c, and 100d. However, in FIG. 8B, the vibrating body 210 of the first piezoelectric vibrating portion 100a and the vibrating body 210 (also referred to as second vibrating body 210) of the second piezoelectric vibrating portion 100b adjacent to the first piezoelectric vibrating portion 100a are bonded together with an adhesive layer 270, while the piezoelectric element 110 of the second piezoelectric vibrating portion 100b and the piezoelectric element 110 of the third piezoelectric vibrating portion 100c adjacent to the second piezoelectric vibrating portion 100b are bonded together with an adhesive layer 270.

A piezoelectric drive device 10c shown in FIG. 8C includes two piezoelectric vibrating portions 100e and 100f. These piezoelectric vibrating portions 100e and 100f are each configured to include the piezoelectric element 110 on both surfaces of the vibrating body 210. The piezoelectric element 110 of the first piezoelectric vibrating portion 100e and the piezoelectric element 110 of the second piezoelectric vibrating portion 100f adjacent to the first piezoelectric vibrating portion 100e are bonded together with an adhesive layer 270.

As described above, the piezoelectric drive device 10 may have a configuration in which two or more piezoelectric vibrating portions 100 are stacked in the normal direction of the vibrating body 210. Due to this, the drive power can be made large. In the embodiment, the piezoelectric drive device 10 has a configuration in which two or more piezoelectric vibrating portions 100 are stacked in the normal direction of the vibrating body 210; however, two or more piezoelectric vibrating portions 100 may be disposed along the plane of the vibrating body 210.

Figure 9A:
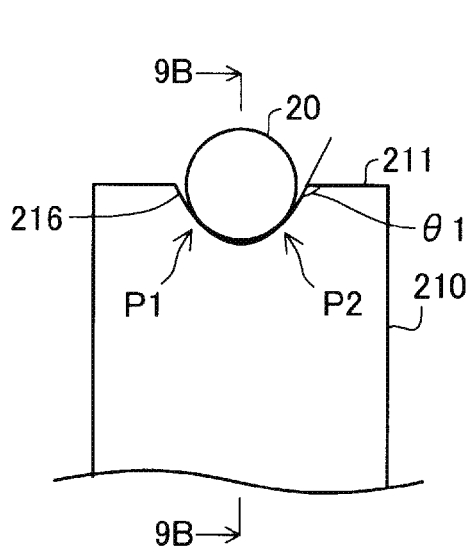
FIGS. 9A to 9D are explanatory views showing, in an enlarged manner, a joining portion between a vibrating body and a contact.
Figure 9B:
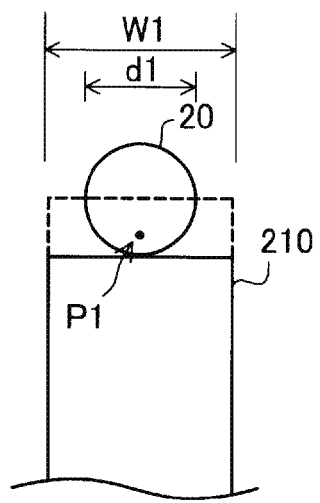

FIGS. 9A to 9D are explanatory views showing, in an enlarged manner, a joining portion between the vibrating body 210 and the contact 20. FIG. 9A is a plan view; and FIG. 9B is a cross-section along 9B-9B of FIG. 9A. The recess 216 is formed in the middle portion of the side 211 of the vibrating body 210. An angle θ1 formed by the recess 216 and the side 211 at the boundary therebetween when viewed in the thickness direction of the vibrating body 210 (FIG. 9A) is preferably in the range of from 120 to 170 degrees. The contact 20 is a sphere or ellipsoid. A diameter d1 in the case of a sphere, or a minor axis (size measured in the thickness direction of the vibrating body 210) in the case of an ellipsoid, is preferably smaller than a thickness W1 of the vibrating body 210. The recess 216 has a size (capacity) capable of accommodating 30 to 70% of the volume of the contact 20. As a result, 70 to 30% of the contact 20 is exposed, and the contact 20 can contact the rotor 50 at the exposed portion (FIG. 4). Here, the capacity of the recess 216 is the difference between the volume of the vibrating body 210 when the side 211 is linearly formed without the recess 216 and the volume of the vibrating body 210 with the recess 216. When the exposed amount of the contact 20 is too small, the contact 20 is less likely to contact the rotor 50; while when the exposed amount of the contact 20 is too large, the contact 20 is likely to come off. Moreover, it is preferable to form the concave shape of the recess 216 such that the contact 20 and the recess 216 contact each other at two points P1 and P2 or at two or more points.

Figure 9C:
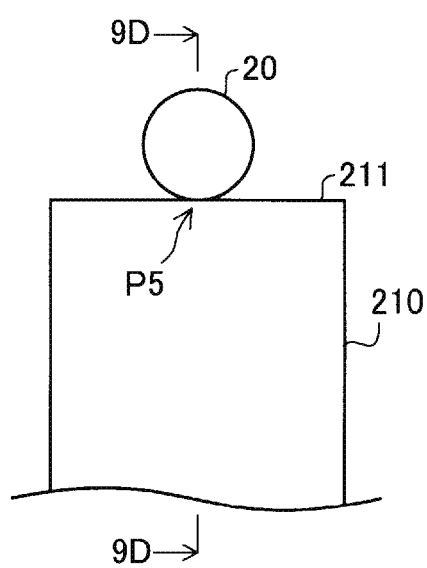
Figure 9D:
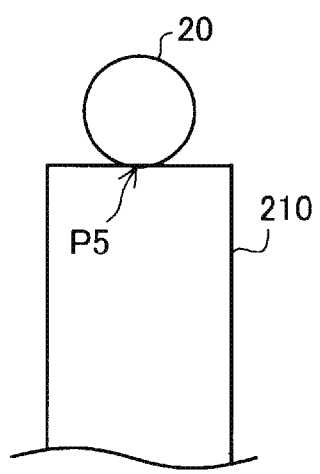

FIG. 9C is a plan view of a comparative example; and FIG. 9D is a cross-section along 9D-9D of FIG. 9C. In the comparative example, the recess 216 is not formed at the side 211, and the contact 20 is bonded to the side 211. One hundred percent of the volume of the contact 20 is exposed from the side 211, and the contact 20 and the side 211 contact each other only at a point P5. Hence, the contact 20 is likely to come off. In the embodiment, as shown in FIGS. 9A and 9B, by fitting the contact 20 into the recess 216, the contact 20 is supported at two points, and can be made less likely to come off.

Figure 10A:
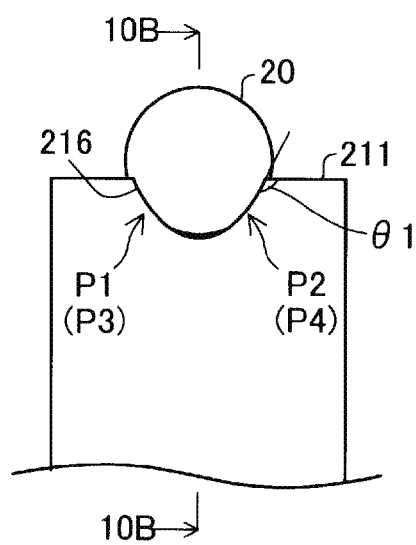
FIGS. 10A and 10B are explanatory views showing, in an enlarged manner, a joining portion between vibrating bodies and a contact in a configuration in which the vibrating bodies of the piezoelectric vibrating portions are opposed to each other.
Figure 10B:
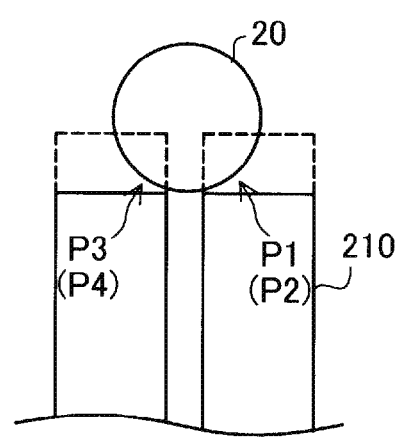

FIGS. 10A and 10B are explanatory views showing, in an enlarged manner, a joining portion between the vibrating bodies 210 and the contact 20 in a configuration in which the vibrating bodies 210 of the piezoelectric vibrating portions 100 are opposed to each other and which is a modification of the configuration of FIG. 8B. FIG. 10A is a plan view; and FIG. 10B is a cross-section along 10B-10B of FIG. 10A. The recess 216 is formed in each of the middle portions of the sides 211 of the two vibrating bodies 210. The contact 20 is placed astride the two recesses 216 of the two vibrating bodies 210 and accommodated in the two recesses. The contact 20 contacts one of the two recesses 216 at two points P1 and P2 and contacts the other of the two recesses 216 at two points P3 and P4, so that the contact 20 is in contact with the two recesses 216 at four points P1 to P4 in total. As a result, the contact 20 can be stably supported, and can be made less likely to come off.

Figure 11A:
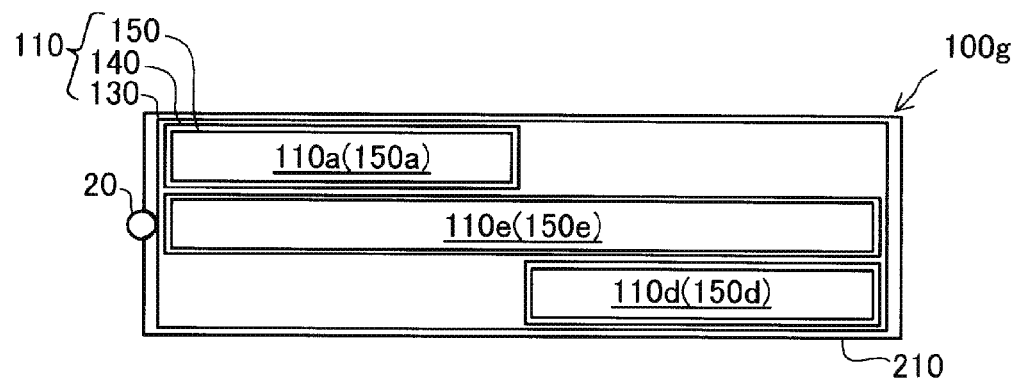
FIGS. 11A to 11C are plan views of piezoelectric vibrating portions as other embodiments.
Figure 11B:
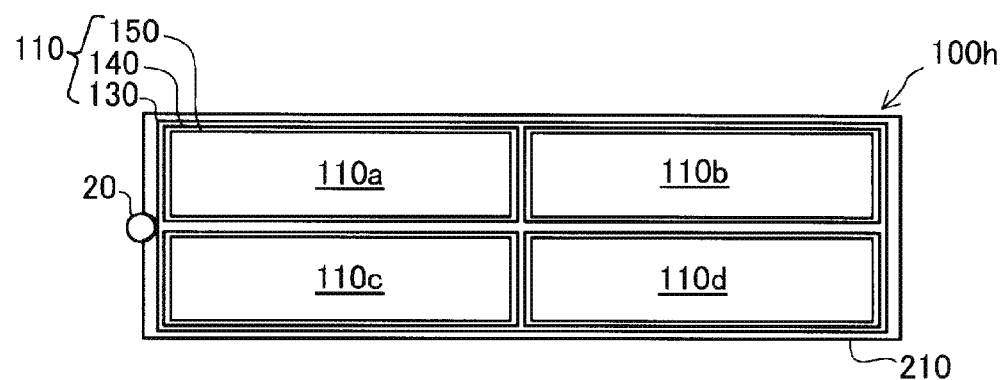
Figure 11C:
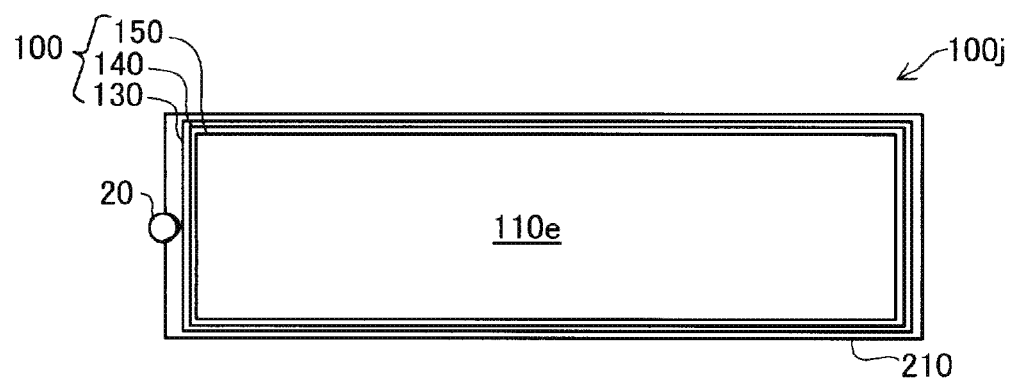

FIGS. 11A to 11C are plan views of the piezoelectric vibrating portion 100 as other embodiments of the invention, corresponding to FIG. 1A of the first embodiment. In FIGS. 11A to 11C, for convenience of illustration, only the vibrating body 210 is illustrated, and the support portion 220 and the connecting portions 222 and 223 are omitted. In a piezoelectric vibrating portion 100g of FIG. 11A, a pair of piezoelectric elements 110b and 110c are omitted. The piezoelectric vibrating portion 100g can also rotate the rotor 50 in one direction z shown in FIG. 4. Since the same voltage is applied to three piezoelectric elements 110a, 110e, and 110d in FIG. 11A, second electrodes (150a, 150e, and 150d) of these three piezoelectric elements 110a, 110e, and 110d may be formed as one continuous electrode layer.

FIG. 11B is a plan view of a piezoelectric vibrating portion 100h as still another embodiment of the invention. In the piezoelectric vibrating portion 100h, the piezoelectric element 110e in the middle in FIG. 1A is omitted, and the other four piezoelectric elements 110a, 110b, 110c, and 110d are formed to have an area larger than that in FIG. 1A. The piezoelectric vibrating portion 100c can also achieve almost the same advantageous effects as the first embodiment.

FIG. 11C is a plan view of a piezoelectric vibrating portion 100j as further another embodiment of the invention. In the piezoelectric vibrating portion 100j, the four second electrodes 150a, 150b, 150c, and 150d in FIG. 1A are omitted, and one second electrode 150e is formed to have a large area. The piezoelectric vibrating portion 100d only expands or contracts in the longitudinal direction, but can provide large power from the contact 20 to the driven body (not shown).

As can be seen from FIGS. 1A and 1B and FIGS. 11A to 11C, at least one electrode layer can be provided as the second electrode 150 of the piezoelectric vibrating portion 100. However, when the piezoelectric element 110 (the second electrode 150) is provided in diagonal positions of the vibrating body 210 having a rectangular shape as in the embodiments shown in FIG. 1A and FIGS. 11A and 11B, the provision is preferred because the vibrating body 210 can be deformed in a serpentine shape in which the vibrating body 210 flexes in the plane thereof.

Figure 12:
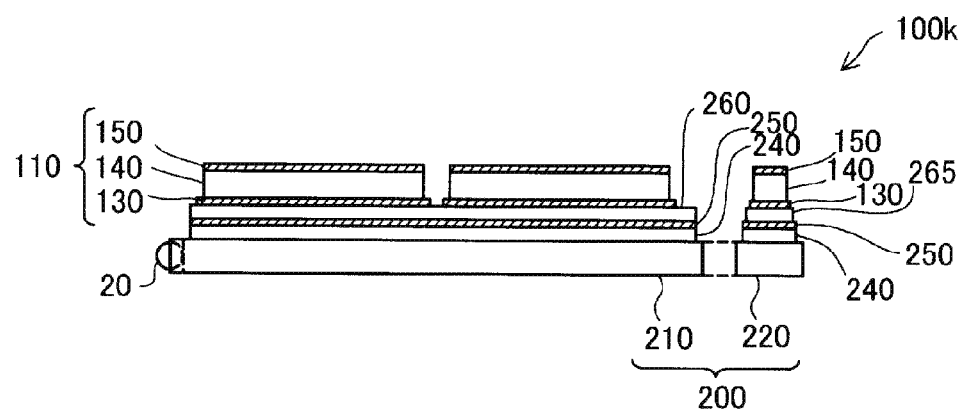
FIG. 12 is an explanatory view showing another configuration of a piezoelectric vibrating portion.

FIG. 12 is an explanatory view showing another configuration of the piezoelectric vibrating portion 100. A piezoelectric vibrating portion 100k is different, compared with the piezoelectric vibrating portion 100 shown in FIGS. 1A and 1B, in the following respects. In the piezoelectric vibrating portion 100 shown in FIGS. 1A and 1B, the piezoelectric element 110 is formed on the substrate 200, and the insulating layer 240, the wiring electrode 250, and the protective film 260 are formed on the piezoelectric element 110. In the piezoelectric vibrating portion 100k shown in FIG. 12, the insulating layer 240, the wiring electrode 250, and an insulating layer 265 are formed on the substrate 200, and the piezoelectric element 110 is disposed on the insulating layer 265. That is, the wiring electrode 250 is formed closer to the substrate 200 side than the piezoelectric body 140. Such a configuration may also be employed. In the case of this configuration, since the piezoelectric body 140 is not present below the wiring electrode 250 and thus the wiring electrode 250 is not affected by the piezoelectric body 140 thickness, there is an advantageous effect that the wiring electrode 250 is less likely to be disconnected.

Embodiment of Apparatus Using Piezoelectric Drive Device

The piezoelectric drive device 10 described above can provide large power to a driven member by the use of resonance, and can be applied to various apparatuses. The piezoelectric drive device 10 can be used as a drive device in various apparatuses such as, for example, a robot (including an electronic component conveying apparatus (IC handler)), a dosing pump, a calendar drive apparatus of a clock, and a printing apparatus (e.g., a paper feed mechanism; however, a vibrating plate is not resonated in a piezoelectric drive device used in a head, and therefore, the piezoelectric drive device cannot be applied to a head). Hereinafter, representative embodiments will be described.

Figure 13:
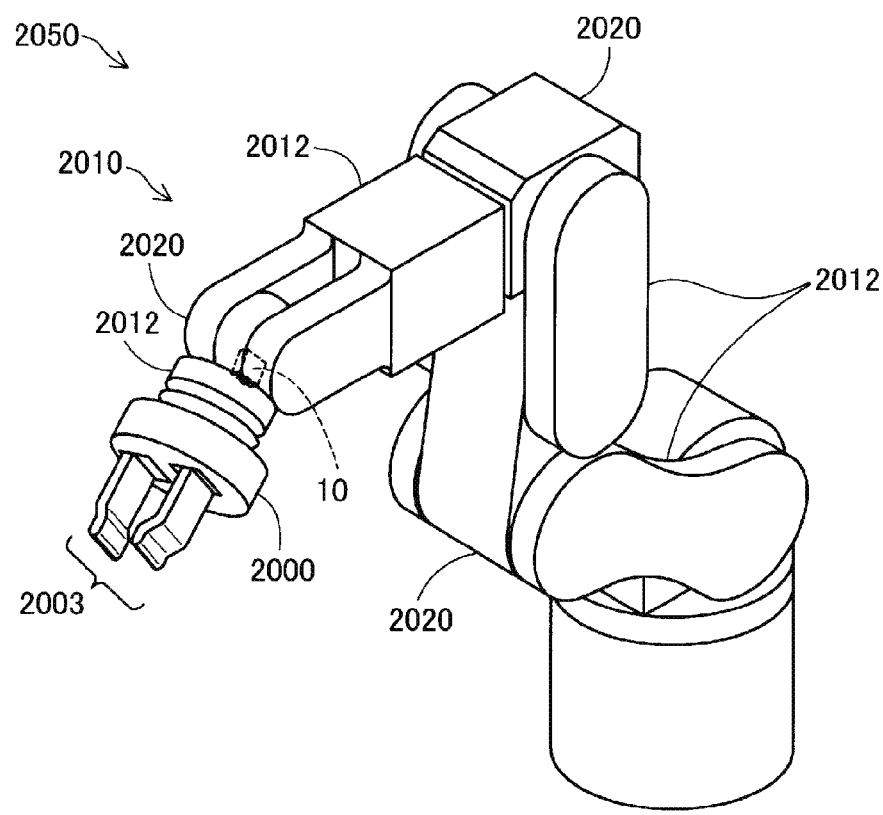
FIG. 13 is an explanatory view showing an example of a robot using the piezoelectric drive device.

FIG. 13 is an explanatory view showing an example of a robot 2050 using the piezoelectric drive device 10 described above. The robot 2050 includes an arm 2010 (also referred to as "arm portion") including a plurality of link portions 2012 (also referred to as "link members") and a plurality of joints 2020 each of which connects the link portions 2012 together in a rotatable or flexible state. The piezoelectric drive device 10 described above is incorporated into each of the joints 2020, so that the joint 2020 can be rotated or flexed by any angle using the piezoelectric drive device 10. A robot hand 2000 is connected to the tip of the arm 2010. The robot hand 2000 includes a pair of gripping portions 2003. The piezoelectric drive device 10 is also incorporated into the robot hand 2000, so that an object can be gripped by opening and closing the gripping portions 2003 using the piezoelectric drive device 10. Moreover, the piezoelectric drive device 10 is provided also between the robot hand 2000 and the arm 2010, so that the robot hand 2000 can be rotated with respect to the arm 2010 using the piezoelectric drive device 10.

Figure 14:
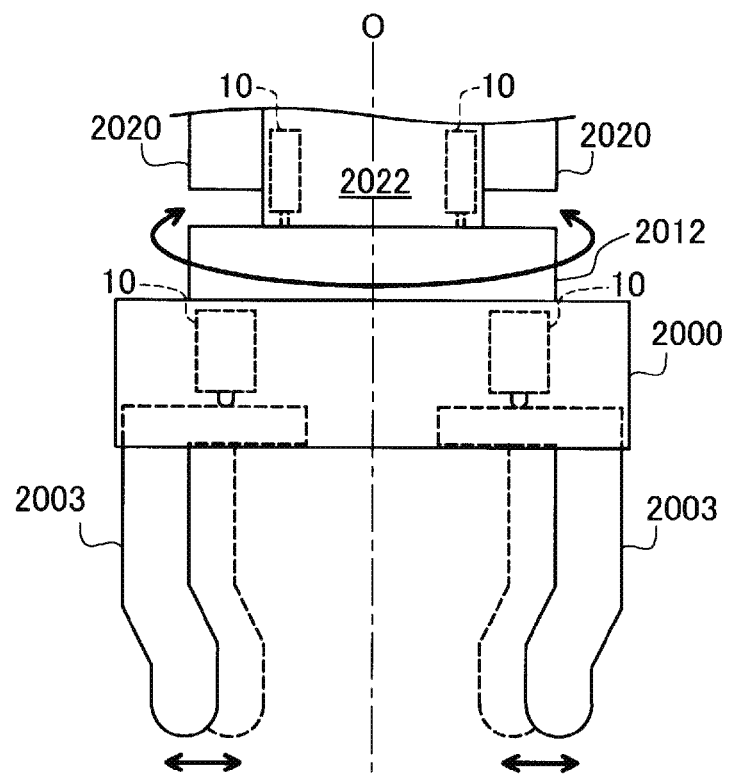
FIG. 14 is an explanatory view of a wrist portion of the robot.

FIG. 14 is an explanatory view of a wrist portion of the robot 2050 shown in FIG. 13. The joints 2020 of the wrist interpose a wrist rotating portion 2022, and the link portion 2012 of the wrist is attached to the wrist rotating portion 2022 rotatable about a central axis O of the wrist rotating portion 2022. The wrist rotating portion 2022 includes the piezoelectric drive device 10, so that the piezoelectric drive device 10 rotates the link portion 2012 of the wrist and the robot hand 2000 about the central axis O. The plurality of gripping portions 2003 are erected on the robot hand 2000. The proximal end portion of the gripping portion 2003 can move in the robot hand 2000, and the piezoelectric drive device 10 is mounted on the base portion of the gripping portions 2003. For this reason, by operating the piezoelectric drive device 10, the gripping portions 2003 can be moved to grip a target object.

The robot is not limited to a single-arm robot, and the piezoelectric drive device 10 can also be applied to a multi-arm robot having two or more arms. Here, in addition to the piezoelectric drive device 10, an electric power line for supplying electric power to various devices such as a force sensor or a gyro sensor, or a signal line for transmitting signals, is included in the interior of the joint 2020 of the wrist or the robot hand 2000, and thus a large number of wirings are necessary. Therefore, it is very difficult to dispose wirings in the interior of the joint 2020 or the robot hand 2000. However, in the piezoelectric drive device 10 of the embodiment described above, a drive current can be made smaller than that of a general electric motor or a related-art piezoelectric drive device, and therefore, wirings can be disposed even in a small space such as the joint 2020 (particularly a joint at the tip of the arm 2010) or the robot hand 2000.

Figure 15:
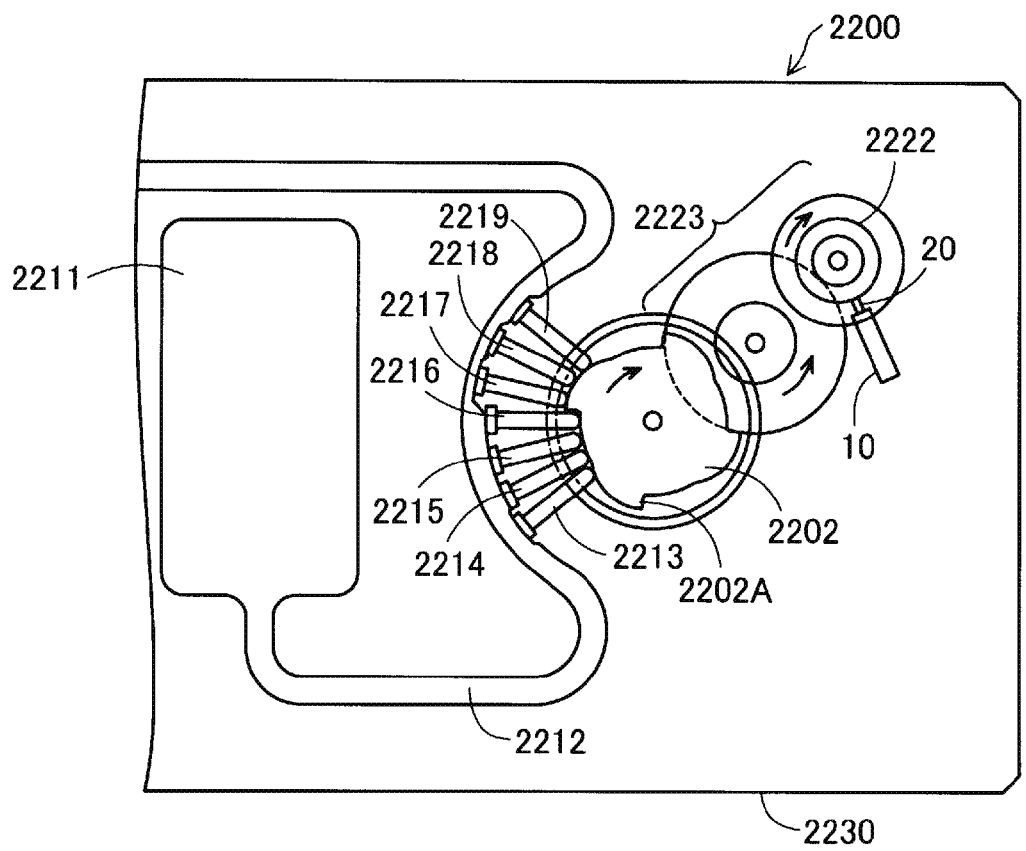
FIG. 15 is an explanatory view showing an example of a liquid feed pump using the piezoelectric drive device.

FIG. 15 is an explanatory view showing an example of a liquid feed pump 2200 using the piezoelectric drive device 10 described above. The liquid feed pump 2200 includes, in a case 2230, a reservoir 2211, a tube 2212, the piezoelectric drive device 10, a rotor 2222, a deceleration transmission mechanism 2223, a cam 2202, and a plurality of fingers 2213, 2214, 2215, 2216, 2217, 2218, and 2219. The reservoir 2211 is an accommodating portion for accommodating liquid as a target to be transported. The tube 2212 is a tube for transporting the liquid sent from the reservoir 2211. The contact 20 of the piezoelectric drive device 10 is provided in a state of being pressed against the side surface of the rotor 2222, and the piezoelectric drive device 10 rotationally drives the rotor 2222. The rotational force of the rotor 2222 is transmitted to the cam 2202 via the deceleration transmission mechanism 2223. The fingers 2213 to 2219 are members for blocking the tube 2212. When the cam 2202 rotates, the fingers 2213 to 2219 are sequentially pressed outward in the radial direction by a projecting portion 2202A of the cam 2202. The fingers 2213 to 2219 sequentially block the tube 2212 from the upstream side (the reservoir 2211 side) in the transportation direction. Due to this, the liquid in the tube 2212 is sequentially transmitted to the downstream side. By doing this, it is possible to realize the liquid feed pump 2200 capable of accurately feeding an extremely small amount of liquid and having a small size. The arrangement of each member is not limited to that shown in the drawing. Moreover, a configuration may be employed, in which a member such as the finger is not provided and a ball or the like provided on the rotor 2222 blocks the tube 2212. The liquid feed pump 2200 described above can be used for a dosing apparatus or the like that administers a medicinal solution such as insulin to the human body. Here, by the use of the piezoelectric drive device 10 of the embodiment described above, a drive current becomes smaller than that of a related-art piezoelectric drive device, and therefore, power consumption of the dosing apparatus can be suppressed. Therefore, when the dosing apparatus is driven with a battery, the use of the piezoelectric drive device 10 is particularly effective.

The embodiments of the invention have been described above based on some examples. However, the above embodiments of the invention are for facilitating the understanding of the invention and not for limiting the invention. The invention may be modified or improved without departing from the gist thereof and the scope of the appended claims, and the invention, of course, includes the equivalents of the modification or improvement.

The entire disclosure of Japanese Patent Application No. 2015-134198, filed Jul. 3, 2015 is expressly incorporated by reference herein.

What is claimed is:

1. A piezoelectric drive device comprising:
   a first monolithic substrate, the first monolithic substrate being configured with:
      a first vibrating body; and
      a first support member that is continuously formed with the first vibrating body so as to support the first vibrating body;
   a second monolithic substrate, the second monolithic substrate being configured with:
      a second vibrating body; and
      a second support member that is continuously formed with the second vibrating body so as to support the second vibrating body;
   a first piezoelectric element that is disposed on a surface of the first vibrating body, the first piezoelectric element being configured with a first electrode film formed on the surface of the first vibrating body, a first piezoelectric body film formed on the first electrode film, and a second electrode film formed on the first piezoelectric body film; and
   a second piezoelectric element that is disposed on a surface of the second vibrating body, the second piezoelectric element being configured with a third electrode film formed on the surface of the second vibrating body, a second piezoelectric body film formed on the third electrode film, and a fourth electrode film formed on the second piezoelectric body film,
   wherein the first vibrating body, the first support member, and the first piezoelectric element configure a first piezoelectric vibrating member, and
   the second vibrating body, the second support member, and the second piezoelectric element configure a second piezoelectric vibrating member.

2. The piezoelectric drive device according to claim 1, wherein
   the second piezoelectric vibrating member is stacked on the first piezoelectric vibrating member.

3. The piezoelectric drive device according to claim 1, wherein
   each of the surfaces of the first and second vibrating bodies, on which the first and second piezoelectric elements are formed, respectively, has a rectangular shape including a first side, a second side, a third side, and a fourth side, the third and fourth sides are connected between the first side and the second side, and each of the third and fourth sides is longer than the first side,
   each of the first and second support members includes a fixed member, a first connecting member, and a second connecting member,
   the first connecting member connects the third side with the fixed member,
   the second connecting member connects the fourth side with the fixed member, and
   the fixed member is disposed on a side closer to the second side than the first side.

4. The piezoelectric drive device according to claim 3, wherein
   first and second wirings for driving the first and second piezoelectric elements are formed on the first and second vibrating bodies, the first connecting members, the second connecting members, and the fixed members, respectively.

5. The piezoelectric drive device according to claim 1, further comprising a third piezoelectric body film formed on the first support member.

6. The piezoelectric drive device according to claim 3, wherein
each of the first and second vibrating bodies includes a recess at the first side,
a contact member that is connectable to a driven member is provided in the recess, and
the recess and the contact member contact each other at two or more points.

7. The piezoelectric drive device according to claim 6, wherein
the recess has a size of accommodating 30 to 70% of the volume of the contact member.

8. The piezoelectric drive device according to claim 6, wherein
the contact member contacts the recess of the first vibrating body at two or more points, and
the contact member contacts the recess of the second vibrating body at two or more points.

9. The piezoelectric drive device according to claim 1, wherein
the first and second vibrating bodies and the first and second support members contain silicon.

10. A robot comprising:
a plurality of links;
a plurality of joints, each of the plurality of joints connecting adjacent two of the plurality of links together; and
the piezoelectric drive device according to claim 1 which rotates the plurality of links with respect to the plurality of joints.

11. A robot comprising:
a plurality of links;
a plurality of joints, each of the plurality of joints connecting adjacent two of the plurality of link together; and
the piezoelectric drive device according to claim 2, which rotates the plurality of links with respect to the plurality of joints.

12. A robot comprising:
a plurality of links;
a plurality of joints, each of the plurality of joints connecting adjacent two of the plurality of links together; and
the piezoelectric drive device according to claim 3 which rotates the plurality of links with respect to the plurality of joints.

13. A robot comprising:
a plurality of links;
a plurality of joints, each of the plurality of joints connecting adjacent two of the plurality of links together; and
the piezoelectric drive device according to claim 4 which rotates the plurality of links with respect to the plurality of joints.

14. A method for driving the piezoelectric drive device according to claim 1, comprising:
applying, between the first electrode film and the second electrode film, a first pulsating voltage that periodically changes, a direction of an electric field of the first pulsating voltage to be applied to the first piezoelectric body film of the first piezoelectric element is one direction from one of the first electrode film and the second electrode film toward the other of the first electrode film and the second electrode film; and
applying, between the third electrode film and the fourth electrode film, a second pulsating voltage that periodically changes, a direction of an electric field of the second pulsating voltage to be applied to the second piezoelectric body film of the second piezoelectric element is one direction from one of the third electrode film and the fourth electrode film toward the other of the third electrode film and the fourth electrode film.

15. A method for driving the piezoelectric drive device according to claim 2, comprising:
applying, between the first electrode film and the second electrode film, a pulsating voltage that periodically changes, a direction of an electric field of the first pulsating voltage to be applied to the first piezoelectric body film of the first piezoelectric element is one direction from one of the first electrode film and the second electrode film toward the other of the first electrode film and the second electrode film; and
applying, between the third electrode film and the fourth electrode film, a second pulsating voltage that periodically changes, a direction of an electric field of the second pulsating voltage to be applied to the second piezoelectric body film of the second piezoelectric element is one direction from one of the third electrode film and the fourth electrode film toward the other of the third electrode film and the fourth electrode film.

16. A method for driving the piezoelectric drive device according to claim 3, comprising:
applying, between the first electrode film and the second electrode film, a pulsating voltage that periodically changes, a direction of an electric field of the first pulsating voltage to be applied to the first piezoelectric body film of the first piezoelectric element is one direction from one of the first electrode film and the second electrode film toward the other of the first electrode film and the second electrode film; and
applying, between the third electrode film and the fourth electrode film, a second pulsating voltage that periodically changes, a direction of an electric field of the second pulsating voltage to be applied to the second piezoelectric body film of the second piezoelectric element is one direction from one of the third electrode film and the fourth electrode film toward the other of the third electrode film and the fourth electrode film.

17. A method for driving the piezoelectric drive device according to claim 4, comprising:
applying, between the first electrode film and the second electrode film, a pulsating voltage that periodically changes, a direction of an electric field of the first pulsating voltage to be applied to the first piezoelectric body film of the first piezoelectric element is one direction from one of the first electrode film and the second electrode film toward the other of the first electrode film and the second electrode film; and
applying, between the third electrode film and the fourth electrode film, a second pulsating voltage that periodically changes, a direction of an electric field of the second pulsating voltage to be applied to the second piezoelectric body film of the second piezoelectric element is one direction from one of the third electrode film and the fourth electrode film toward the other of the third electrode film and the fourth electrode film.

* * * * *